United States Patent
Taninaka et al.

[11] Patent Number: 5,997,152
[45] Date of Patent: Dec. 7, 1999

[54] LIGHT EMITTING ELEMENT MODULE AND PRINTER HEAD USING THE SAME

[75] Inventors: Masumi Taninaka; Mitsuhiko Ogihara; Takatoku Shimizu, all of Tokyo, Japan

[73] Assignee: Oki Electric Industry Co., Ltd., Tokyo, Japan

[21] Appl. No.: 08/929,759

[22] Filed: Sep. 15, 1997

[51] Int. Cl.$^6$ .................. F21V 21/00; B41J 2/45
[52] U.S. Cl. .......... 362/249; 362/800; 347/238; 347/130; 257/88; 257/910
[58] Field of Search ............ 257/88, 910, 911, 257/918; 361/760, 783; 346/139 R; 347/238; 362/800, 249, 227

[56] References Cited

U.S. PATENT DOCUMENTS

| | | | |
|---|---|---|---|
| 4,857,801 | 8/1989 | Farrell | 313/500 |
| 5,519,430 | 5/1996 | De Cock | 347/248 |
| 5,677,552 | 10/1997 | Ogura | 257/113 |
| 5,691,760 | 11/1997 | Hosier | 347/248 |

FOREIGN PATENT DOCUMENTS

| | | |
|---|---|---|
| 60-13575 | 1/1985 | Japan . |
| 2-10879 | 1/1990 | Japan . |
| 5-42718 | 2/1993 | Japan . |
| 9-283807 | 10/1997 | Japan . |

OTHER PUBLICATIONS

"Light Emitting Diode", Yasuo Okuno, pp. 164–165, Published by Sangyo Tosho Co., Ltd. on Jan. 20, 1993.

*Primary Examiner*—Alan Cariaso
*Assistant Examiner*—Marshall Honeyman
*Attorney, Agent, or Firm*—Weneroth, Lind & Ponack, L.L.P.

[57] ABSTRACT

A light emitting element module is provided including a board and plural chips arranged in the form of an array on the board. Each chip includes at least one light emitting element having a light emitting function and/or a photosensing function. The chips are arranged on the board so that the upper surfaces of adjacent chips which are located opposite to the board are positionally displaced in the height direction of the chips by at least the distance corresponding to the thickness of the chips. This uneven chip arrangement in the height direction may be established by alternately arranging thicker chips and thinner chips on the board.

26 Claims, 8 Drawing Sheets

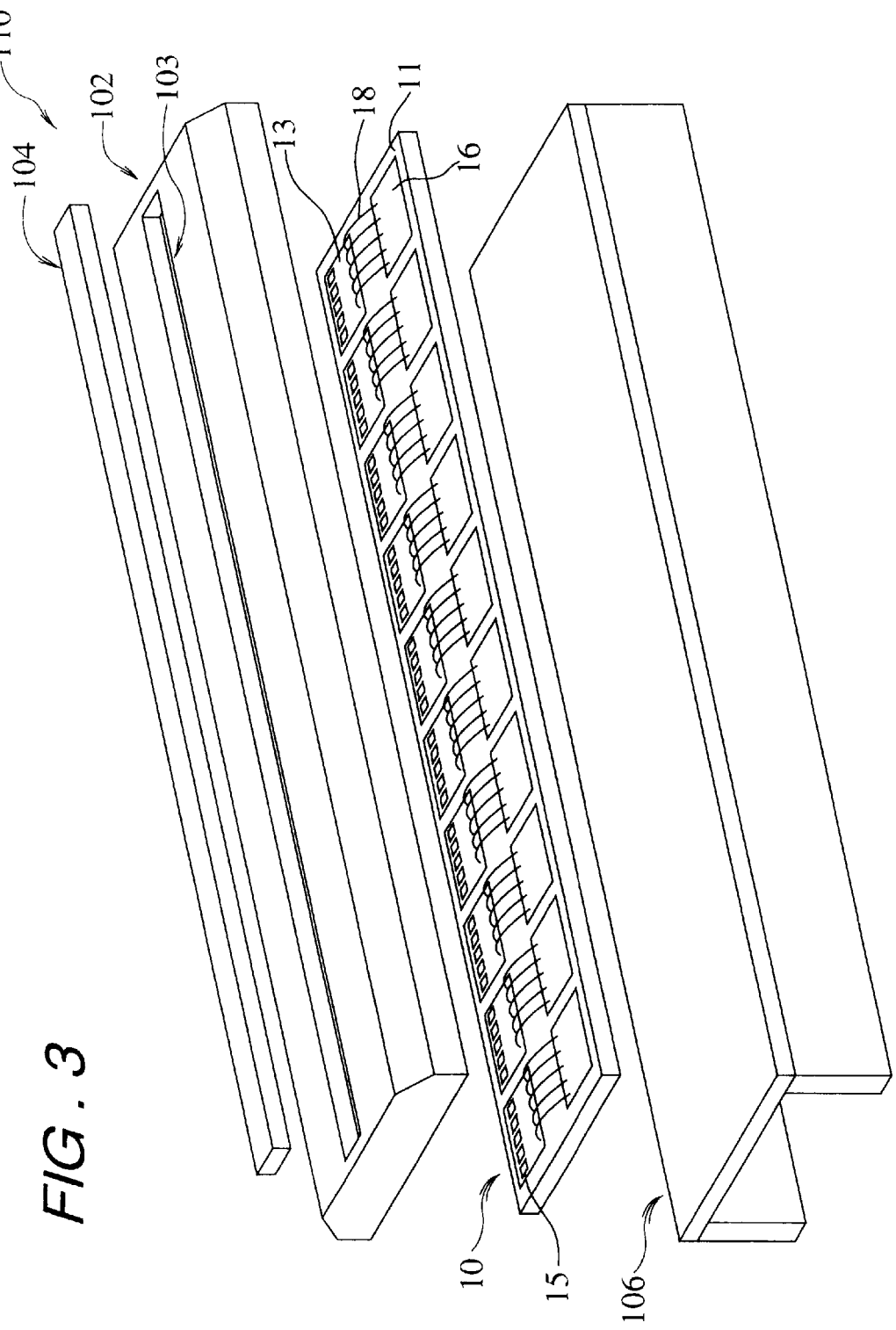

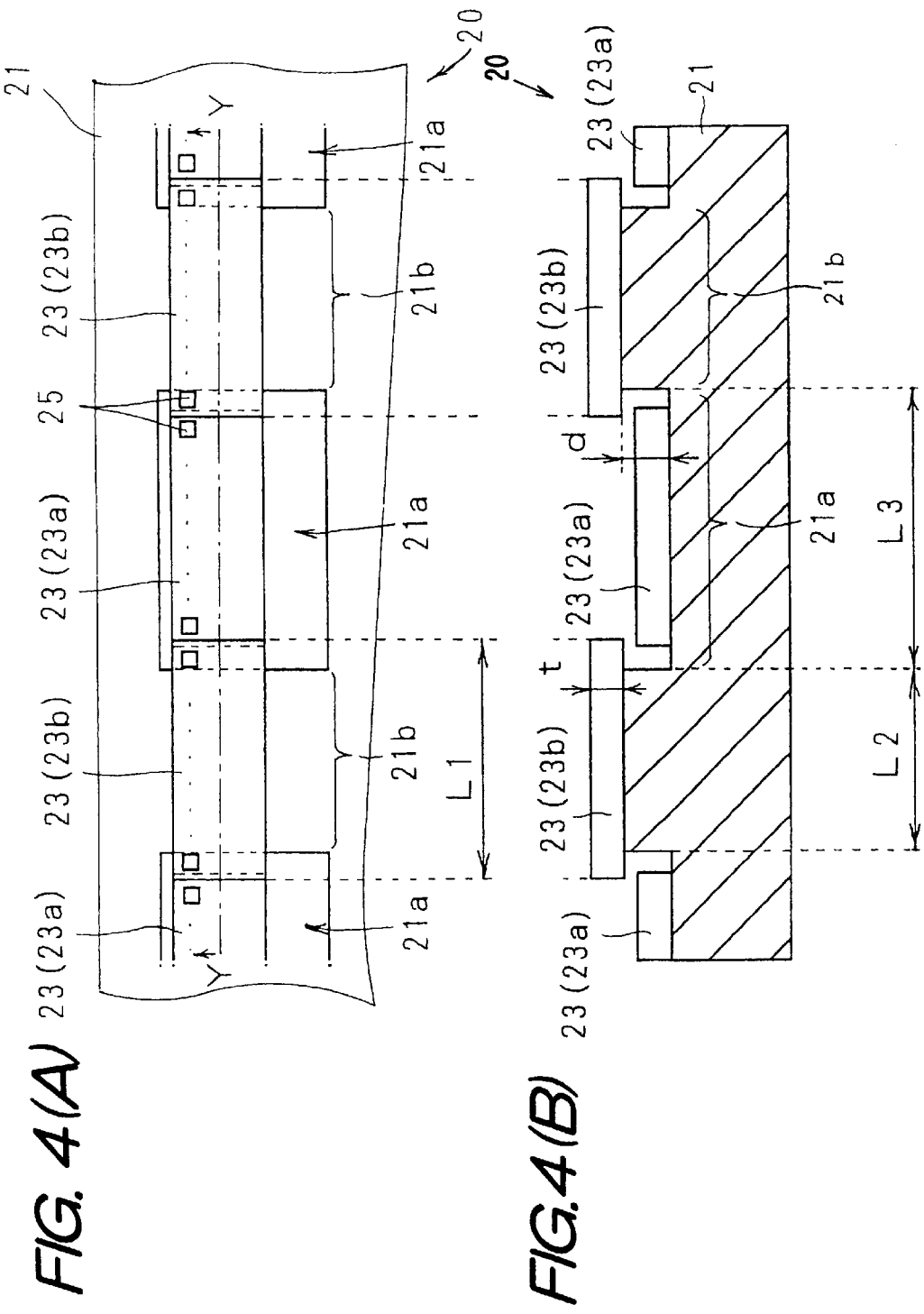

LIGHT EMITTING ELEMENT MODULE AND PRINTER HEAD USING THE SAME

BACKGROUND OF THE INVENTION

1. Field of the Invention

The present invention relates to a light emitting element module and a printer head using the same.

2. Description of the Related Art

There has been known one type of light emitting element module in which a plurality of rectangular-parallelpiped chips each including plural LEDs (Light Emitting Diodes) (i.e., "LED array") are arranged on a board (this type of light emitting element module is hereinafter referred to as "LED module").

When an LED is used as a light emitting element, the LED module is used as a light source for an LED print head for use in an electrophotographic printer, for example. On the other hand, when an LED is used as a light emitting element having a photosensitive (photodetecting) function as well as a light emitting function, the LED module is also usable as a reading/writing head for reading and writing characters, images, etc.

FIGS. 1(A) and 1(B) are plan views schematically showing a part of this type of LED module. Particularly, FIG. 1(B) is an enlarged view showing a part of the LED module which is surrounded by a broken line in FIG. 1(A). In FIGS. 1(A) and 1(B), reference numeral 1 represents a board, reference numeral 3 represents a chip and reference numeral 5 represents a light emitting element. When the distance between chips (inter-chip distance) is represented by x and the distance (chip edge margin) between the chip edge and the leftmost (or rightmost) light emitting element (dot) is represented by y in the LED module, the values of x and y are determined in consideration of the following conditions (1) to (3).

(1) The inter-chip distance x is set to such a value as satisfies the following conditions: A) the mutual interference between neighboring chips due to the different in thermal expansion coefficient between the chip and the board can be prevented; and B) even when a chip is mounted on the board or a defective chip is replaced with a new one, the arrangement of adjacent chips can prevented from being disturbed or the adjacent chips can be prevented from being damaged.

(2) The chip edge margin y is set to such a value as satisfies the following conditions: A) there is no probability that the device characteristics can be prevented from being deteriorated due to leakage of light to the side surface at the chip edge; and B) it is easy to cut out (dice) plural chips formed in a wafer individually.

(3) In order to keep the dot pitch constant over the entire LED module, the pitch (dot pitch) z between light emitting elements at the chip edges of adjacent chips and the dot pitch z between light emitting elements on each chip are set to be equal to or approximate to each other.

The values of x and y are determined on the basis of the tradeoffs of the conditions (1) to (3), and the chips are successively mounted on the board by die-bonding or the like to form an LED module.

However, the above-described conventional light emitting element module has such a problem that it is difficult to keep a sufficient inter-chip distance under the condition (3) for a chip having light emitting elements which are arranged in high density.

For example, the following table shows the possible inter-chip distance x for the chip edge margins y of 4 µm and 8 µm when the resolution of the LED module is set to 400 DPI, 600 DPI, 1200 DPI and 2400 DPI.

TABLE 1

MAXIMUM INTER-CHIP DISTANCEs

|  | chip edge margin = 4 µm | chip edge margin 8 µm |
| --- | --- | --- |
| 400 DPI | 55.5 µm | 47.5 µm |
| 600 DPI | 34.3 µm | 26.3 µm |
| 1200 DPI | 13.0 µm | 5.0 µm |
| 2400 DPI | 2.5 µm | unmeasurable |

It is readily understood from the above table 1 that as the resolution of the LED module is increased, the possible inter-chip distance x is reduced. As the inter-chip distance is reduced, when a chip is arranged or a defective chip is removed, the chip comes into contact with other chips adjacent thereto. Consequently, the probability that the arrangement of the chips is disturbed or the chips are damaged is increased. Therefore, it is more and more difficult to perform a chip arrangement process and a defective chip replacement process. The table 1 shows two cases where the chip edge margin is set to 4 µm and 8 µm. However, upon considering a bonding error, etc., it has been recognized that it is substantially difficult to perform an accurate mounting process for chips having a density (resolution) of 1200 DPI or more even when another chip edge margin value which satisfies the condition (2) is adopted.

SUMMARY OF THE INVENTION

Therefore, an object of the present invention is to provide a light emitting element module to which the chips can be accurately mounted even if the chips have highly-densified light emitting elements, and to which the chips are easily mounted and replaced.

In the following description, the mount position in the height direction of the chip is introduced to compare the position of same part of each chip, and typically it corresponds to the position of the bottom surface, the upper surface or the like to each chip in the height direction (the thickness direction of each chip). Further, the displacement (offset) of a chip by at least the distance corresponding to the thickness of the chip means that the mount position of a chip concerned is displaced by at least the distance corresponding to the thickness of a chip adjacent to the chip concerned. With this definition, the present invention is applicable to any case where the respective chips have the same thickness or a different thickness.

In order to attain the above object, according to a first aspect of the present invention, a light emitting element module includes a board. Plural chips are arranged in the form of an array on the board, and each chip includes a plurality of light emitting elements each having a light emitting function. The chips are arranged on the board so that the upper surfaces of adjacent chips, which are the surfaces located opposite to (not adjacent to) the board, are positionally displaced (offset) in the height (vertical) direction of the chips.

According to the light emitting element module of the first aspect of the present invention, a chip mount process and a defective-chip replace process can be more efficiently performed (i.e., the workability is enhanced) because the upper surfaces of the chips are not disposed on the same plane.

In the above light emitting element module, the upper surfaces of the plural chips, which are the surfaces located opposite to (not adjacent to) the board, are positionally displaced in the height (vertical) direction of the chips alternately in the direction of the chip arrangement.

In addition, the gap in height between the upper surfaces of the chips is reduced.

The chips have the same thickness, and a chip mount position in the height direction on the board is varied between adjacent chips by at least the distance corresponding to the thickness of the chips.

The side surfaces of the adjacent chips do not confront each other, so that there occurs little interference between adjacent chips during the chip mount (arranging) process and the chip replacement process.

Every other chip mount target position on the board at which the chips will be mounted is designed as a projecting portion which is projected by at least the amount larger than the thickness of said chips. The chips are arranged on the projecting portions and in recess portions which are formed between the projecting portions.

Each of the chips includes plural light emitting elements which are arranged at regular intervals thereon, and the chips are arranged in the horizontal direction so that the interval between the light emitting elements at the edges of adjacent chips is equal to the interval of light emitting elements arranged on each chip.

The chips are arranged on the board so that the outermost edges of the adjacent side surfaces of adjacent chips are aligned with each other in the vertical direction.

The chips are arranged on the board so that the outermost edges of adjacent side surfaces of adjacent chips are overlapped with each other in the vertical direction.

The chips can be arranged in high density while keeping the sufficient chip edge margin.

The projecting portions and the recess portions are formed by cutting the boards or the projecting portions in the recess portions are formed by providing additional members on the board.

The width of each of the recess portions in a direction perpendicular to the chip arrangement direction is set to be larger than the width of each of the chips in a direction perpendicular to the chip arrangement direction.

The length of each of the projecting portions in the chip arrangement direction is set to be shorter than the length of each of the chips in the chip arrangement direction.

Each of the light emitting elements comprises a light emitting diode.

Each of the light emitting elements has both a light emitting function and a photosensing function.

Each of the light emitting elements selectively exhibits one of the light emitting function and the photosensing function by switching an application direction of a bias voltage to the chips.

The chips comprise a group of thicker chips and a group of thinner chips which are smaller in thickness than the thicker chips.

The thicker chips and the thinner chips are alternately arranged on the board.

The side surfaces of the thicker chips which confront the thinner chips are designed to be inclined in sectional profile taken along the chip arrangement direction such that the upper sides of the thicker chips are overhung.

The inclined surface is overhung, and thus the sufficient inter-chip distance can be obtained in the horizontal direction on the plane containing the upper surface of the thinner chip (in the height of the upper surface of the thinner chip). Therefore, even when the chips are arranged in high density, there can be suppressed such a risk that when a chip is mounted or exchanged, the chip is brought into contact with an adjacent chip thereto to disturb the arrangement of the adjacent chip or damage the adjacent chip. As a result the chips can be accurately mounted in high density, and defective chips can be readily exchanged.

Further, the chips are not arranged so that the upper surfaces of adjacent chips are aligned with each other on the same plane. Instead, the chip mount position in the height direction of the chips is displaced (varied) between the adjacent chips. In addition, the side surface of the thicker chip whose upper surface is higher than that of the adjacent chip (thinner chip) is designed to be upwardly extensively inclined (overhung at the upper side thereof), whereby the chip edge margin can be set to a longer value by the amount corresponding to the overhand area as compared with the case where the side surface is designed to be perpendicular to the surface of the board.

The outermost edges of the confronting side of the chips are aligned with each other in the vertical direction.

The outermost edges of the confronting sides of the chips are overlapped with each other in the vertical direction.

Even when the integration degree of the light emitting elements is enhanced, the chips can be arranged at the same pitch as the light emitting elements while keeping a fixed margin between the chips because of the overhang structure of the chips.

The side surfaces of the thinner chips which confront the thicker chips are designed to be inclined in sectional profile taken along the chip arrangement direction such that the upper sides of the thinner chips are overhung.

According to the above light emitting element module, the inter-chip distance on the surface of the board can be set to a sufficient value.

Each of the light emitting elements comprises a light emitting diode.

Each of the light emitting element has both a light emitting function and a photosensing function.

In the above light emitting element module, each of the light emitting elements selectively exhibits one of the light emitting function and the photosensing function by switching an application direction of a bias voltage to the chips.

According to a second aspect of the present invention, there is provided a printer head with a light emitting element module including a board. Plural chips are arranged in the form of an array on the board, and each chip includes a plurality of light emitting elements each having a light emitting function. The chips are arranged on the board so that the upper surfaces of adjacent chips, which are the surfaces located opposite to the board, are positionally displaced in the height (vertical) direction of the chips alternately in the direction of the chip arrangement. The chips have the same thickness, and a chip mount position in the height direction on the board is displaced between adjacent chips by at least the distance corresponding to the thickness of the chips. The chips are arranged on the board so that the outermost edges of the adjacent side surfaces of adjacent chips are aligned with each other in the vertical direction, or the chips are arranged on the board so that the outermost edges of adjacent chips are overlapped with each other in the vertical direction.

BRIEF DESCRIPTION OF THE DRAWINGS

The foregoing and other objects, features and advantages of the present invention will be better understood from the following description taken in connection with the accompanying drawings; in which:

FIG. 3 is an exploded view showing an LED printer head using the LED module of the first embodiment;

FIGS. 4(A) and 4(B) are diagrams showing an LED module according to a second embodiment of the present invention;

DETAILED DESCRIPTION OF THE PREFERRED EMBODIMENTS

Preferred embodiments according to the present invention will be described hereunder with reference to the accompanying drawings. In the respective figures, the size, the shape, the positional relationship, etc. of constituent elements are illustrated schematically to the extent that the present invention is understandable, and thus the present invention is not limited to the illustrated embodiments. Further, hatching for indicating cross-sectional part is omitted from the illustration except that some parts are hatched. In the following embodiments, the present invention is typically applied to an LED module for an LED print head which is one type of light emitting element module. However, it is apparent to those in the art that the present invention is not limited to the LED module.

First Embodiment

Figure 1A:
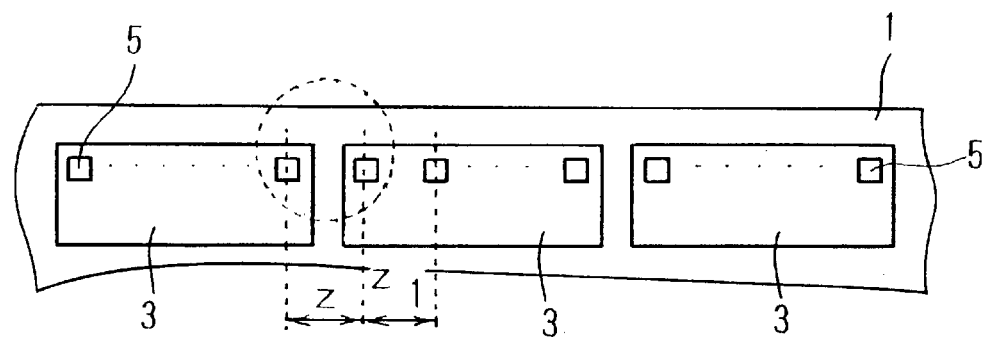
FIG. 1(A) is a plan view showing the surroundings of a chip which is a part of an LED module.
Figure 1B:
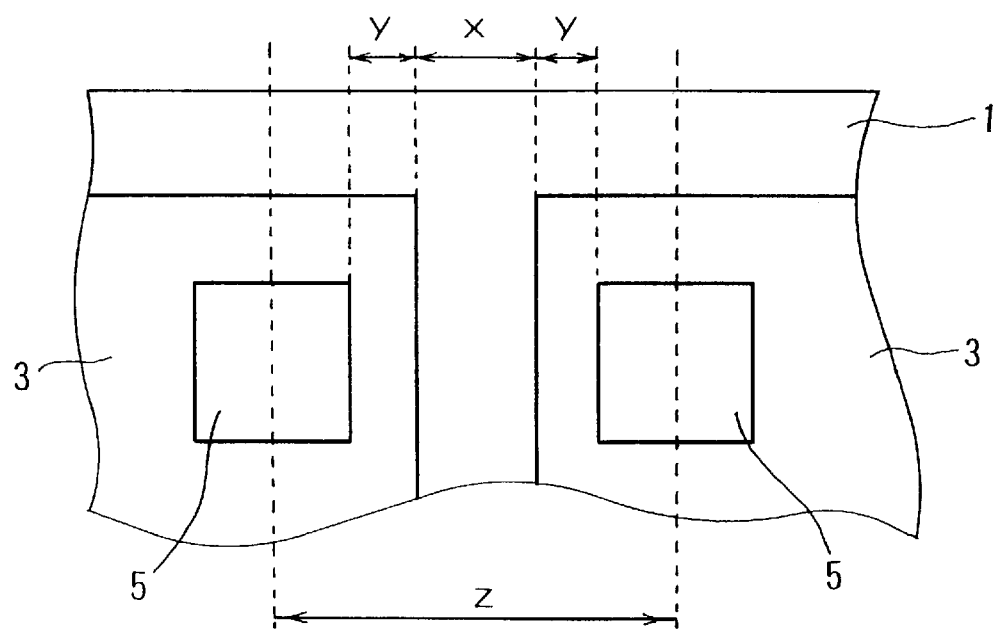
FIG. 1(B) is an enlarged view showing a part of the LED module which is surrounded by a broken line in FIG. 1(A)
Figures 2A, 2B:
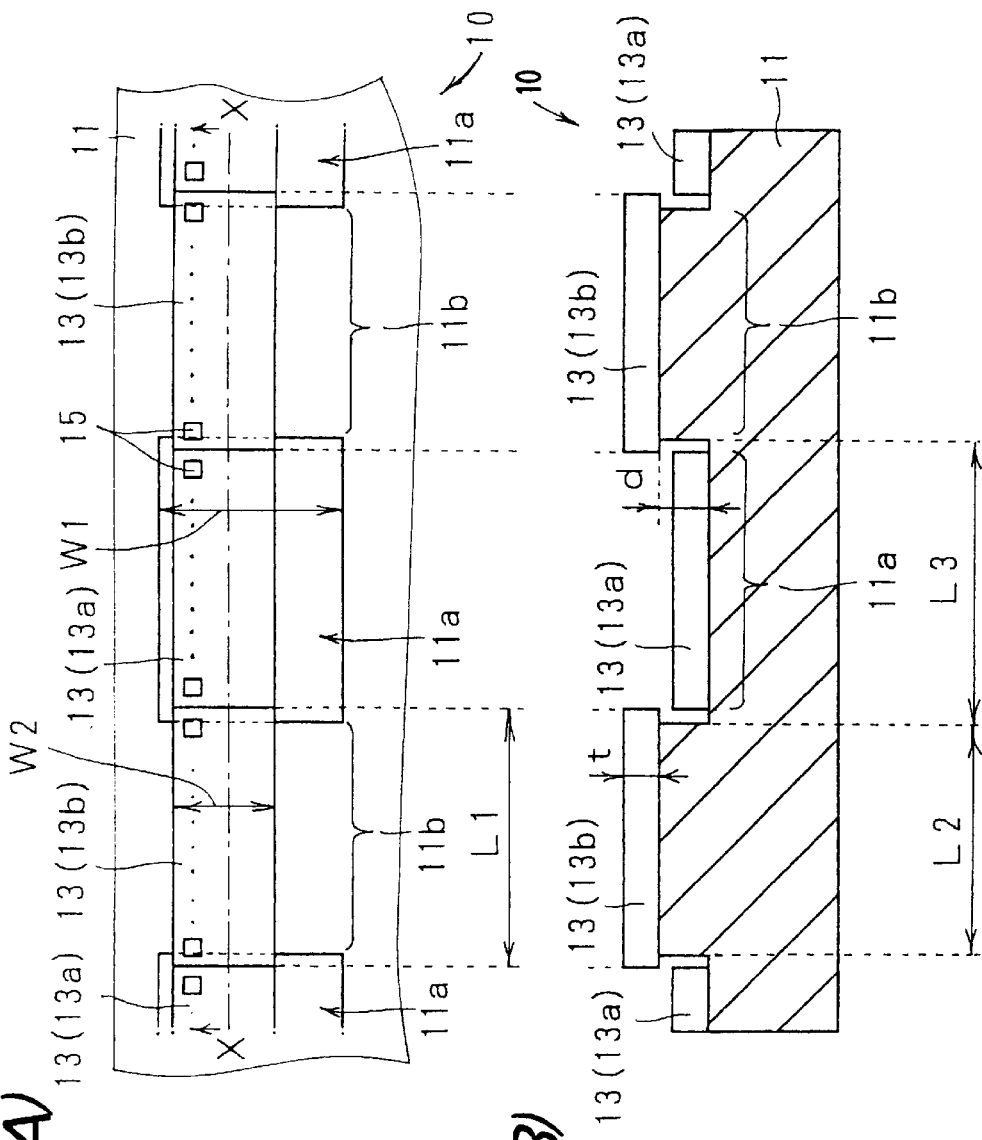
FIGS. 2(A) and 2(B) are diagrams showing an LED module according to a first embodiment of the present invention.

FIGS. 2(A) and 2(B) are diagrams showing a light emitting element module according to a first embodiment of the present invention, wherein FIG. 2(A) is a plan view which schematically shows a part of an LED module for an LED print head, and FIG. 2(B) is a cross-sectional view of the LED module which is taken along an X—X line in FIG. 2(A). Wiring, etc. on a board 11 are omitted from the illustration for clarity.

The light emitting element module according to the first embodiment includes plural chips 13 which are arranged on a board (print circuit board) 11. Each of the chips has plural light emitting elements 15. Further, all the chips 13 are assumed to have the same thickness t.

According to the light emitting element module, each odd-numbered chip and each even-numbered chip are mounted on the board 11 so that they are displaced (offset) from each other in the height direction (i.e., in the thickness direction of the module). In other words, the chip mount position in the height direction is displaced (offset or staggered) between the odd-numbered chip and the even-numbered chip by at least the distance corresponding to the thickness of a chip. More specifically, when the LED module 10 is viewed from the upper side (see FIG. 2(A)), chips 13 (each of which includes plural light emitting elements LEDs) 15) are arranged in the form of an array with no gap therebetween. In addition, from a cross-sectional view which is taken along the arrangement direction of the chips 13 (in the lateral direction of FIG. 2(A)) so as to contain the chips 13 (see FIG. 2(B)), the mount position in the height direction is displaced (offset) between adjacent chips 13 by a distance which is greater than the thickness of the chip 13.

The LED module of this embodiment is basically constructed as described above, and thus it specifically has the following structure.

The leftmost chip and, subsequently, every other chip is arranged from the leftmost chip to the right side, are set as odd-numbered chips 13a. The chip adjacent to the leftmost chip and, subsequently, every other chip is arranged from that chip to the right side are set as even-numbered chips 13b. The even-numbered chips 13b are placed on projecting portions 11b on the board 11 as shown in FIG. 2(B). On the other hand, the odd-numbered chips 13a are placed in recess portions 11a on the board 11 as shown in FIG. 2(B). That is, the board 11 is designed to have a regularly uneven surface. The step d between the recess portion 11a and the projecting portion 11b is set to such a value that the difference of the mount position in the height direction (the thickness direction of the chips) between each odd-numbered chip and each even-numbered chip is equal to or larger than the thickness t of each chip. However, if the step d is excessively long, some trouble would occur. Therefore, an upper limit is required to be imposed on the step d in accordance with the design. For example, it is common in an LED print head that a focusing rod lens array is disposed at a predetermined distance from the LED module 10. In such a case, the permissible maximum step d must be set to a value with the depth of focus of a lens being used. Under this condition, there is no probability that adjacent chips 13 are out of focus. For example, when the thickness t of the chip 13 is set to 0.25 mm, the board 11 is designed to have the recess portions 11a and the projecting portions 11b so that the step d is equal to about 0.3 mm, for example (the present invention is not limited to the values).

In addition to the dimensional setting of the chip arrangement in the height direction (thickness direction) of the chips, the dimension of the recess portions 11a and the projecting portions 11b in a second direction (in the direction of the chip arrangement) is also set. The length L2 of the projecting portion 11b along the second direction is set to be smaller to some degree than the length L1 of each chip 13 along the second direction. Accordingly, the length L2 of the projecting portion 11b in the second direction is set to be smaller than the length L3 of the recess portion 11a in the second direction. That is, the length L2 of the projecting portion 11b along the second direction is smaller than the length L3 of the recess portion 11a along the second direction. This dimensional condition between the recess portion 11a and the projecting portion 11b makes it possible to align or overlap the edges of the chips located on the projecting portion 11b and the recess portion 11a with each other in the vertical direction, so that the chips can be arranged in high density (i.e., a high-density chip array can be achieved).

In the case of the first embodiment, the edge of the chip on the projecting portion 11b and the edge of the chip in the recess portion 11a are aligned (coincident) with each other or substantially aligned (coincident) with each other in the vertical direction. Therefore, the difference in dimension between L1 and each of L2 and L3 may be set to a value which is not so large. For example, when the length L1 of the chip along the second direction is set to 8.0 mm, the length L2 of each projecting portion 11b and the length L3 of the recess portion 11a along the second direction may be set to about 7.98 mm and about 8.02 mm, respectively.

The width W1 of each recess portion 11a along a direction (hereinafter referred to as "first direction") which is perpendicular to the chip arrangement direction (second direction) is set to be larger than the width W2 of the chip 13 along the first direction so that it has extra space (width) when the chip 13 is mounted therein. This extra space structure is adopted because a defective chip is replaced with a new one by displacing the defective chip in the first direction with a rod-shaped tool and then picking it up with tweezers. The width W1 is equal to the total of the width W2 of the chip 13 and the space required for the chip replacement process, and it is set to a value which is larger than the width W2 of the chip 13 and smaller than the width of the board 11.

The LED module 10 as described above is formed by the following method. A cutting process is first applied to those portions of the board 11 on which the odd-numbered chips 13a will be mounted, thereby forming chip mount target portions (recess portions) 11a for the chips 13a and chip mount target portions (projecting portions) 11b for the chips 13b on the board (not shown). At this time, each of the recess portions 11a is formed to have a surplus space to the extent that a defective chip will be readily replaced with a new one. Subsequently, the chips 13 are successively mounted on each projecting portion 11b and in each recess portion 11a.

FIG. 3 is an exploded view showing an LED printer head when the LED module 10 shown in FIG. 2 is used as a part of the LED printer head 110 as described above.

The LED printer head 110 comprises a support member 106, the LED module 10, a rod lens array holder 102, and a rod lens array 104 which are arranged in this order from the lower side of the LED printer head 110. The support member 106 functions to mechanically hold the LED module 10 and also functions as a heat sink for radiating heat which occurs in the LED module 10. The rod lens array holder 102 is directly provided to the upper side of the LED module 10 to accurately position the rod lens array 104 which is mounted in an opening 103 of the holder 102. The rod lens array 104 serves to efficiently focus an LED image onto a photosensitive member.

According to the LED module 10, the mount position in the height direction (the thickness direction of the chips) is displaced between the odd-numbered chip and the even-numbered chip. Further, an IC driver 16 for driving each chip 13 is provided in association with each chip 13 on the board 11. Each light emitting element 15 provided on the surface of each chip 13 is electrically connected to each terminal of each IC driver 16 through a bonding wire 18.

Accordingly, in the LED printer head 110 thus constructed, each IC driver 16 controls each light emitting element 15 to exhibit its light emitting function, whereby information is printed on the photosensitive member through the rod lens array 104.

According to the LED module 10 constituting the LED printer head 110, the gap between adjacent chips 13 is kept large, so that the working space is enlarged. Accordingly, it is easy to mount chips 13 at predetermined positions in a manufacturing process of the LED printer head 110. Further, even when a defective chip occurs due to use of the LED printer head 110, the defective chip can be readily and quickly replaced with a new one.

Second Embodiment

FIGS. 4(A) and 4(B) are diagrams showing a light emitting element module according to a second embodiment of the present invention, wherein FIG. 4(A) is a plan view schematically showing a part of an LED module for an LED print head, and FIG. 4(B) is a cross-sectional view of FIG. 4(A) which is taken along a Y—Y line and viewed from a direction as indicated by an arrow. The same elements as the first embodiment are represented by the same reference numerals, and the duplicative description thereof is omitted.

The LED module 20 of the second embodiment is the same as that of the first embodiment in that all the chips have the same thickness and the chip mount position in the height direction is displaced between adjacent chips by the distance corresponding to the thickness of the chips 23 or more (see FIG. 4(B)). However, the difference between the first and second embodiment resides in that the edge portions of the adjacent chips 23 are overlapped with each other so that any light emitting element 25 on the lower chip 23 (i.e., the chip 23 located in the recess portion) is not covered by the upper chip 23 (i.e., the chip located in the projecting portion) when the LED module 20 is viewed from the upper side (see FIG. 4(A)). In other words, the extra space corresponding to the overlap area is further provided to the chip edge margin.

In the second embodiment, odd-numbered chips 23a and even-numbered chips 23b are defined as in the case of the first embodiment. The chips 23b are located on the projecting portions of a board (print circuit board) 21, and thus steps d are formed due to unevenness of the surface of the board 21. The length of each step d may be determined on the basis of the same considerations as in the first embodiment. Further, according to the second embodiment, in order to overlap the edge portion of the chip on the projecting portion 21b with the edge portion of the chip in the recess portion 21a as compared with the first embodiment, the length L2 of the projecting portion 21b along the second direction is set to be further smaller than the length L1 of the chip 23 along the second direction while the length L3 of the recess portion 21a along the second direction is set to be further longer than the length L1 of the chip 23 along the second direction when the LED module is viewed along the vertical direction. When the length L1 of the chip 23 along the second direction is set to 8.0 mm, the length L2 of the projecting portion 21a along the second direction may be set to about 7 mm (the present invention is not limited to these values).

As described above, the edge portions of the adjacent chips 23 are overlapped with each other such that any light emitting element 25 on the lower chip is not covered with edge portion of the upper chip. Therefore, the same level of chip edge margin (8 $\mu$m) as the width of the light emitting element can be provided to even a 1200 DPI chip in which the dimension of each light emitting element is equal to 8 $\mu$m×8 $\mu$m in square.

As a modification, the edge portions of the adjacent chips (upper chip and lower chip) may be overlapped with each other so that the edge portion of the upper chip covers the light emitting element 25 located at the edge of the lower chip. The light emitting element 25 located at the chip edge may be damaged due to cracks occurring in a dicing work, so that a desired light emission characteristic is not exhibited. In the prior art, any chip having at least a light emitting element 25 which suffers such a damage must be wasted as a defective chip. However, according to the above modification, a chip having such a damaged light emitting element 25 is located as a lower chip in a recess portion and the upper chip (a chip adjacent to the chip having the damaged light emitting element) and the lower chip are arranged so that the damaged light emitting element on the lower chip is covered with the edge portion of the upper chip. Therefore, a chip which has been hitherto wasted as a defective chip in the prior art can be effectively used.

The LED module 20 of the second embodiment is applicable to an LED printer head as in the case of the LED module 10 of the first embodiment.

The LED module 20 as described above is formed by the following method. A cutting process is first applied to those portions of the board 21 on which the chips 23a will be mounted, thereby forming chip mount target portions (recess portions) 21a for the chips 23a and chip mount target portions (projecting portions) 21b for the chips 23b on the board 21. Subsequently, the chips 23 are successively mounted on each projecting portion 21b and in each recess portion 21a on the board 21. In this embodiment, since the chip edge portions are overlapped with each other, the chip mount process can be facilitated by positioning the lower chip 23a and then positioning the upper chip 23b so that the edge portions of the chips are overlapped with each other.

FIGS. 5(A) to 5(D) are perspective views showing various modifications of the board.

Figure 5A:
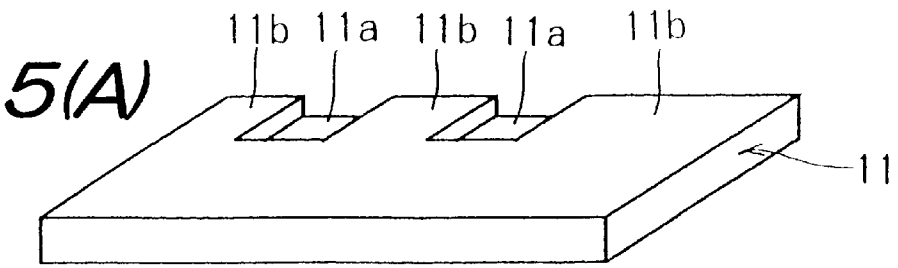
FIGS. 5(A) to 5(D) are perspective views showing modifications of a board.
Figure 5B:
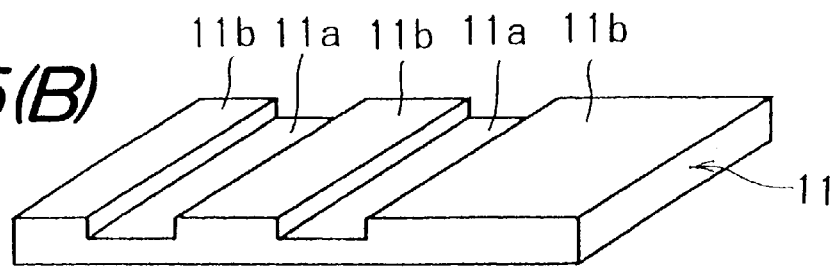
Figure 5C:
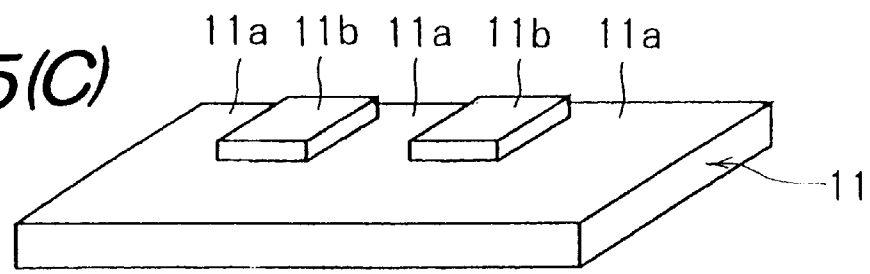
Figure 5D:
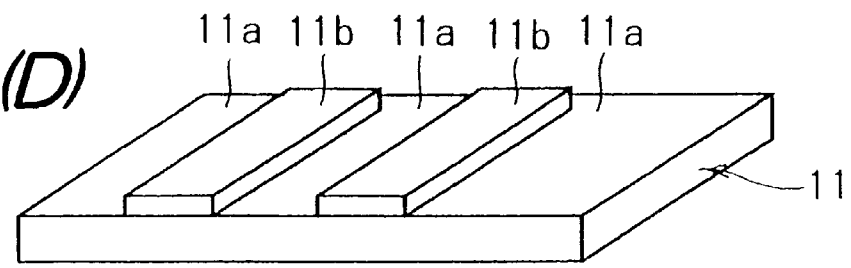

In each of the above-described embodiments, the chip mount target portions (recess portions) for the lower chips are formed by mechanically cutting the surface of the board, and the recess portions are formed in a rectangular recessed shape. However, as shown in FIGS. 5(A) and 5(B), the surface of the board may be cut over a broader range along the first direction as compared with the above-described first and second embodiments. Further, as shown in FIGS. 5(C) and 5(D)), rectangular members which are formed of the same material as the board may be attached onto the chip mount target portions for the chips 23b on the board to form the recess portions and the projecting portions As is apparent from the foregoing description, according to the light emitting element module of the first and second embodiments of the present invention, the chips each of which has plural light emitting elements are arranged in the form of an array on the board. The chip mount position in the height direction is displaced (offset) between the odd-numbered chip and the even-numbered chip by at least the distance corresponding to the thickness of the chips. Therefore, there is implemented the light emitting element module in which the chips are horizontally arranged in the form of an array, and the edge surface of the odd-numbered chip and the edge surface of the even-numbered chip do not confront each other. Accordingly, the adjacent chips do not interfere with each other when the edge portion of the chip located at the higher position (i.e., the upper chip) does not cover the light emitting element at the edge of the chip located at the lower position (i.e., the lower chip). Therefore, with this chip arrangement, it is substantially unnecessary to keep an inter-chip distance between the adjacent chips. Accordingly, chips having light emitting elements which are arranged in high density can be accurately arranged on the board. Further, since the chip edge margin can be kept sufficient, the dicing process for the chips can be readily performed. In addition, even when the edge portion of a chip is chipped or the like, there is no probability that the chip has an adverse effect on the entire device. Therefore, it is expected to produce a light emitting module having higher resolution.

Further, according to the light emitting element module of the first and second embodiment of the present invention, when chips each including plural light emitting elements are arranged in the form of an array on a board to form a light emitting element module, recess portions or projecting portions are formed on every other portions at which the chips will be mounted under the condition that the length of the step between each recess portion and each projecting portion is equal to or larger than the thickness of each chip. Then the chips are arranged in the recess portions and on the projecting portions. By this process, the above described light emitting element module of the first and second embodiment of the present invention can be easily produced.

Accordingly, there can be provided a light emitting element module in which chips can be accurately mounted on the board even when these chips are arranged in high density and, in addition, replacement of defective chips can be readily performed.

Third Embodiment

Figure 6A:
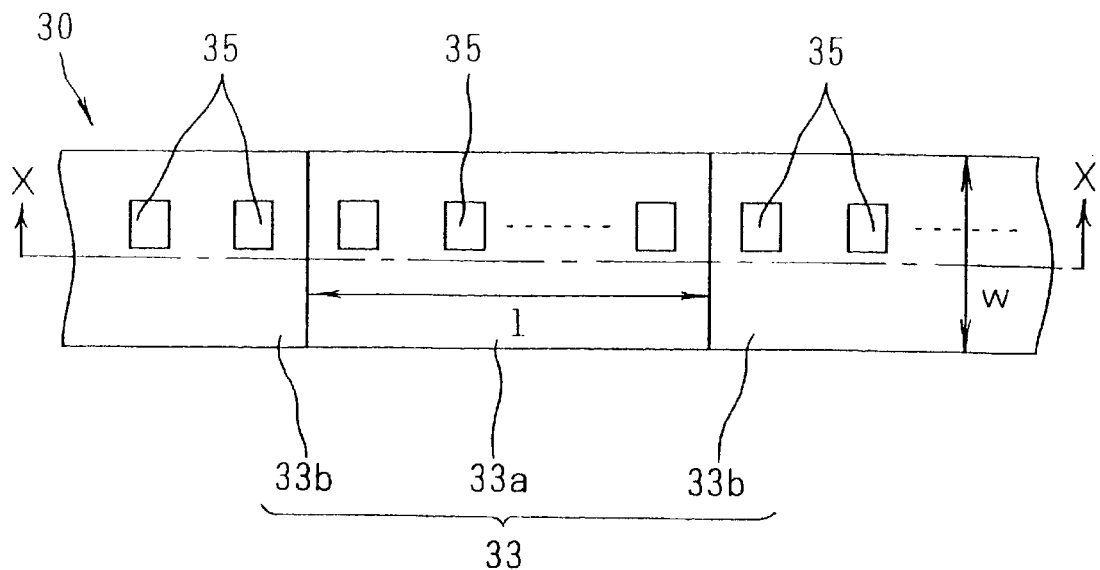
FIGS. 6(A) and 6(B) are diagrams showing a light emitting element module according to a third embodiment of the present invention.
Figure 6B:
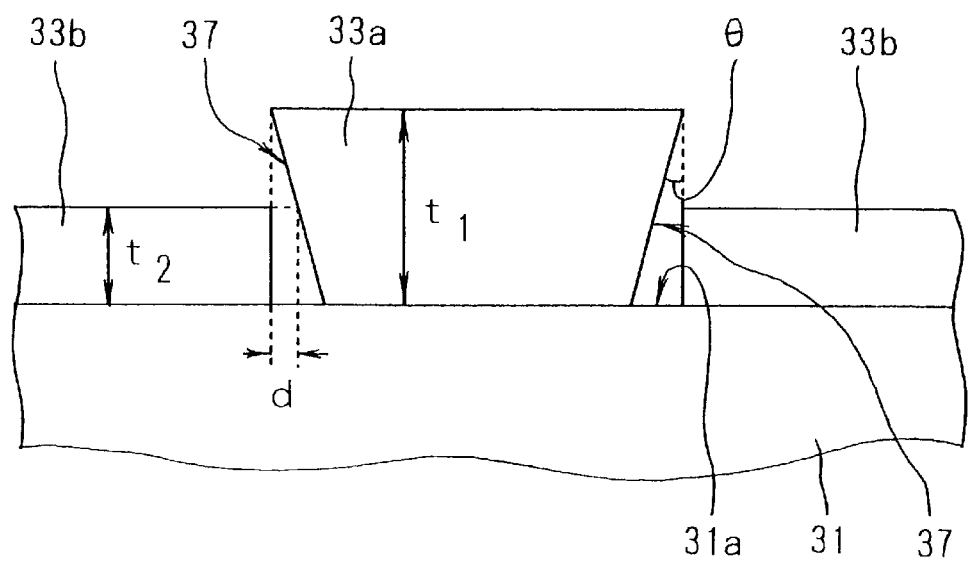

FIGS. 6(A) and 6(B) are diagrams showing a light emitting element module according to a third embodiment of the present invention, wherein FIG. 6(A) is a plan view showing a part of an LED module for an LED print head, and FIG. 6(B) is a cross-sectional view of FIG. 6(A) which is taken along an X—X line and viewed in the direction as indicated by an arrow in FIG. 6(A). Wiring, etc. on a board (print circuit board) 31 are omitted for clarity.

According to the LED module 30 of the third embodiment, chips (LED chips) 33 each including an array of plural light emitting elements (LEDs) 35 are arranged in the form of an array on a flat (plane) surface 31a of a board (print circuit board) 31 so as to be spaced apart from one another. In the LED module thus constructed, the LED chips 33 comprise a group of thicker chips 33a and a group of thinner chips 33b which are smaller in thickness than the thicker chips 33a. The thicker chips 33a and the thinner chips 33b are alternately arranged on the flat surface 31a of the board 31, so that the surfaces of the adjacent chips located opposite to the flat surfaces 31a are positionally displaced in the height direction of the chips. Therefore, the top surfaces of the thicker chips 33a are located at a higher position than the top surfaces of the thinner chips 33b. Both of the side surfaces 37 of each thicker chip 33a which confront the thinner chips 33b adjacent thereto are designed to be upwardly extensively inclined in sectional profile which is taken along the chip arrangement direction (i.e., each thicker chip 33a is designed to be overhung at the upper side thereof). Hereinafter, the side surface 37 of the thicker chip 33a which is upwardly extensively inclined in sectional profile is merely referred to the "inclined surface".

In this embodiment, when the LED module 30 is viewed from the upper side as shown in FIG. 6(A) (i.e., plan view), the chips 33 each including plural light emitting elements (LEDs) 35 are arranged in the form of an array with no gap between adjacent chips. The size of each chip 33 is set to w: 0.70 mm in the lateral direction (the direction along the short sides of the chip, or the direction perpendicular to the chip arrangement direction) and l: 8.0 mm in the longitudinal direction (the direction along the long sides of the chip, or the direction along the chip arrangement direction).

Further, when the LED module is viewed in section (i.e., longitudinal sectional view), the side walls (surfaces) of each thicker chip 33a are designed to be inclined, and thus an inter-chip distance d can be kept between the thicker chip 33a and the thinner chip 33b in the plane containing the upper surface of the thinner chip 33b.

For example, in the case where the thickness t1 of the thicker chip 33a is set to 600 μm and the thickness t2 of the thinner chip 33b is set to 300 μm, if the inclination angle θ of the inclined surface 37 is set to 27°, the inter-chip distance d can be set to about 15 μm in the plane containing the upper surface of the thinner chip 33b. However, there is no gap between the thicker and thinner chips when viewed from the upper side. Further, in the case where the thickness t1 of the thicker chip 33a is set to 400 μm and the thickness t2 of the thinner chip 33b is set to 200 μm, if the inclination angle θ of the inclined surface 37 is set to 35°, the inter-chip distance d can be set to about 15 μm in the plane containing the upper surface of the thinner chip 33b, although there is no gap between the thicker and thinner chips when viewed from the upper side. Here, the inclination angle is defined as an intersecting angle between the inclined surface 37 and the perpendicular of the surface 31a of the board 31.

Accordingly, a sufficient inter-chip distance can be kept in the horizontal direction at the height corresponding to the upper surface of the thinner chip because the sectional profile of the thicker chip is in the overhung shape (inverted trapezoidal shape). Therefore, even when the chips are arranged in high density, there can be suppressed such a risk that when a chip is mounted or replaced with a new one, it is brought into contact with an adjacent chip to disturb the arrangement of the adjacent chip or damage the adjacent chip. Therefore, the chips can be accurately arranged in high density, and a defective chip can be readily replaced with a new one. For, example, if the inter-chip distance is set to about 15 μm, a defective chip can be readily replaced by displacing the defective chip in the direction perpendicular to the arrangement direction of the chips with a rod-shaped tool and then picking it up with tweezers.

Further, since the LED module 30 comprises a light emitting element array for an LED print head as in the case of the LED module 10 of the first embodiment, the lens array is used while disposed at a predetermined interval from the LED module 30. Therefore, if the maximum difference d in height between the upper surfaces of the thicker chip and the thinner chip is set to a value within the depth of focus of the lens, the out-of-focus status between the adjacent chips can be prevented.

The inclined surface of the thicker chip 33a may be formed by performing a dicing process while a dicing cutter is inclined.

Fourth Embodiment

Figure 7A:
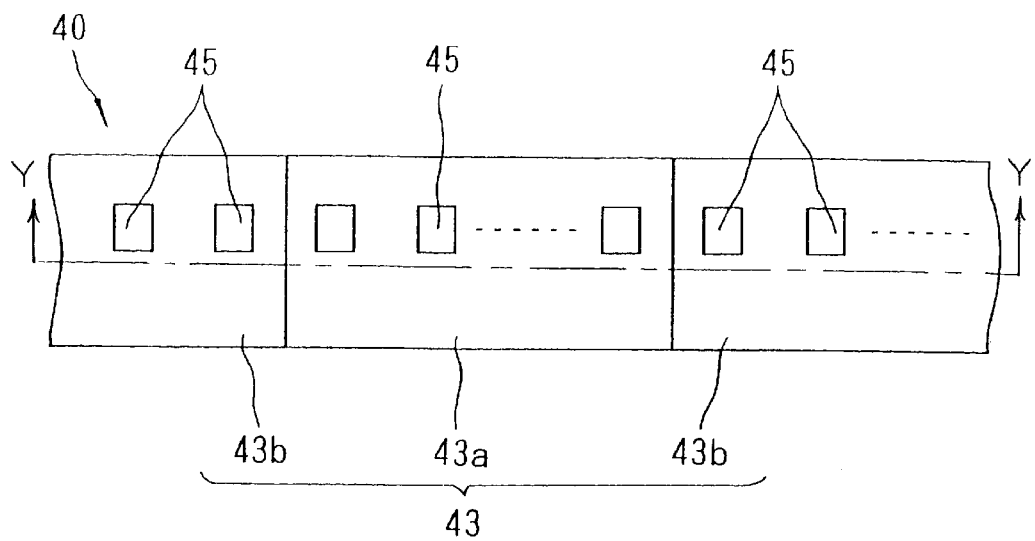
FIGS. 7(A) and 7(B) are diagrams showing a light emitting element module according to a fourth embodiment of the present invention.
Figure 7B:
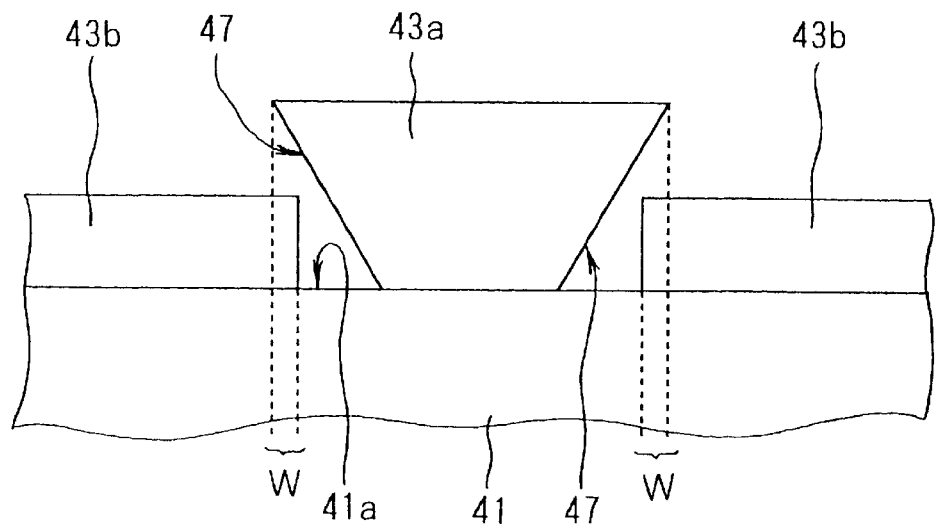

FIGS. 7(A) and 7(B) are diagrams showing a light emitting element module according to a fourth embodiment of the present invention, wherein FIG. 7(A) is a plan view showing a part of an LED module for an LED print head, and FIG. 7(B) is a cross-sectional view of the LED module which is taken along a Y—Y line of FIG. 7(A) and shows the inclined side surface 47. The same elements as the third embodiment are represented by the same reference numerals, and the detailed description thereof is omitted.

According to an LED module 40 of the fourth embodiment, when a flat board surface 41a is viewed from the upper side, the edge portions of a thicker chip 43a and a thinner chip 43b which are adjacent to each other are overlapped with each other as shown in FIG. 7(B). In FIGS. 7(A) and 7(B), an overlap area (overlapped portion) is represented by W.

If the adjacent thicker and thinner chips 43a and 43b are overlapped with each other so that any light emitting element 45 of the thinner chip 43b is not covered by the edge portion of the thicker chip 43a, the chip edge margin can be enlarged by the amount corresponding to the overlap area. For example, even 1200 DPI chips in which the dimension of each light emitting element 45 is 8μ×8μ in square can be provided with the same level of chip edge margin (8 μm) as the width of each light emitting element. The chip edge margin of 8 μm is about twice as large as the chip edge margin of the conventional 1200 DPI LED module.

Fifth Embodiment

Figure 8:
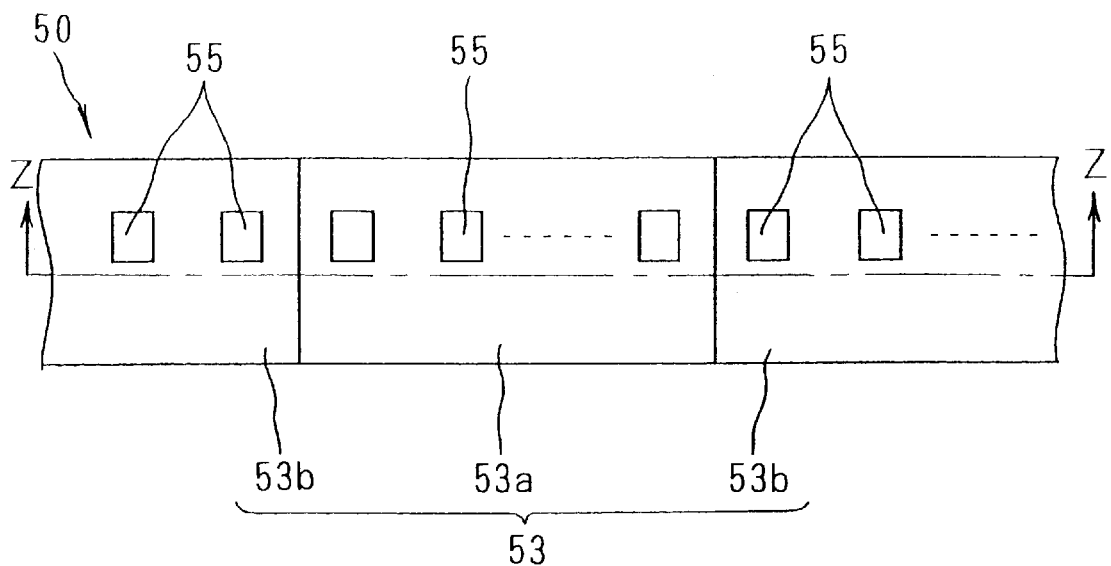
FIGS. 8(A) and 8(B) are diagrams showing a light emitting element module according to a fifth embodiment of the present invention.
Figure 8:
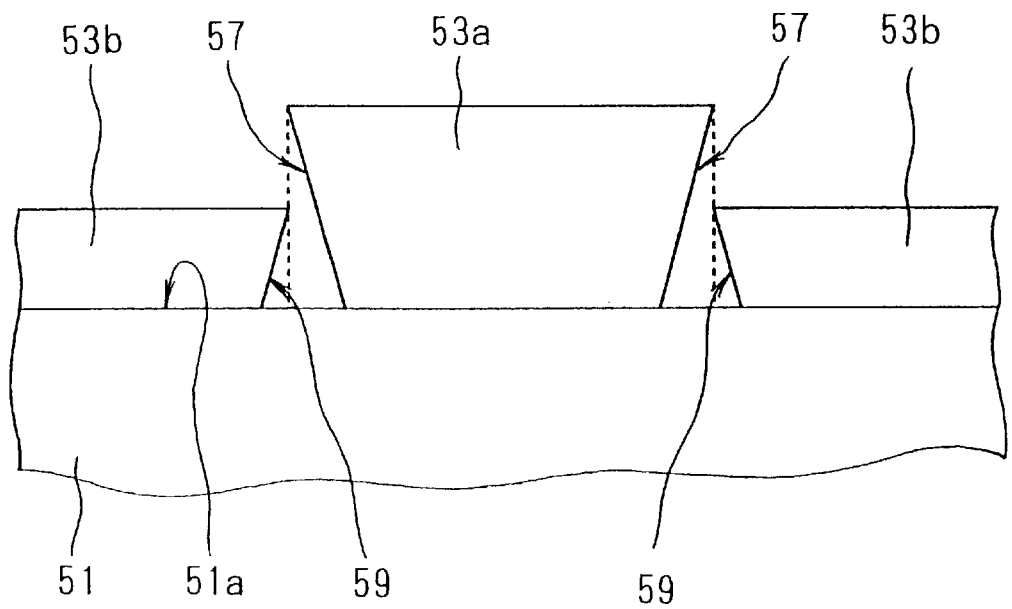

FIGS. 8(A) and 8(B) are diagrams showing a light emitting element module according to a fifth embodiment of the present invention, wherein FIG. 8(A) is a plan view showing a part of an LED module for an LED print head, and FIG. 8(B) is a cross-sectional view of the LED module which is taken along a Z—Z line of FIG. 8(A) and viewed along the direction as indicated by an arrow and shows the inclined side surfaces 57 and 59. The same elements as the third embodiment are represented by the same reference numerals, and the detailed description thereof is omitted.

According to the LED module 50 of the fifth embodiment, the side surface of the thinner chip 53b which is adjacent to the thicker chip 53a is designed to be upwardly extensively inclined in sectional profile which is taken along the chip arrangement direction (i.e., each thinner chip 53b is designed to be overhung at the upper side thereof like the thicker chip 53a, and thus it has an inclined surface 59).

As in the case of the LED module 10 of the first embodiment, the LED module of each of the above-described third to fifth embodiments is applicable to an LED print head.

As is apparent from the foregoing description, according to the light emitting element module of the third to fifth embodiments, the thicker chips and the thinner chips which are thinner than the thicker chips are alternately arranged on the flat board surfaces. Consequently, the surfaces of the adjacent chips located opposite to the flat board surface are positionally displaced in the height direction of the chips, and the side surface of each thicker chip which is adjacent to each thinner chip is designed to be inclined so as to have an overhung shape in the sectional profile taken along the chip arrangement direction (i.e., the length of the top surface of the thicker chip in the chip arrangement direction is larger than the length of the bottom surface of the chip in the chip arrangement direction). Therefore, as compared with the case where the side surface of the chip is designed to be perpendicular to the surface of the board, the inter-chip distance in the horizontal direction in the plane containing the upper surface of the thinner chip (in the height of the upper surface of the thinner chip) can be set to a longer value by the amount corresponding to the overhang portion. Accordingly, even in the high-density arrangement of the chips, there can be suppressed such a risk that when a chip is mounted or replaced, the chip is brought into contact with an adjacent chip to disturb the arrangement of the adjacent chip or damage the adjacent chip, so that defective chips can be readily replaced with new ones. Further, the chip edge margin can be set to a longer value by the amount corresponding to the overhang portion.

Further, since the inclined surfaces of the thicker chips are designed to be overhung, the adjacent chips can be arranged closer to each other so that the light emitting elements at the edges of the chips are nearer to each other so as to keep the same or approximately the same length as the dot pitch (the pitch of the light emitting elements) of each chip between the light emitting elements of the chips. As a result, the light emitting elements can be arranged at a uniform pitch across plural chips while keeping the inter-chip distance.

Still further, if the edge portions of the adjacent thicker and thinner chips are overlapped with each other in the vertical direction to the surface of the board, the chip interval can be set to a longer value by the amount corresponding to the overlap area. In addition, the light emitting elements can be arranged at a uniform pitch because of the overlap structure of the chip edges even when the integration degree of the light emitting elements is increased.

Still further, if the side surface of the thinner chip which is adjacent to the thicker chip is designed to be inclined so that the upper side of the thinner chip is overhung in its sectional profile which is taken along the chip arrangement direction, the inter-chip distance on the board can be set to a longer value.

According to the above-described light emitting element module, even when the chips are arranged in high density, a chip mount process and a defective-chip replacement process can be facilitated because the inter-chip distance can be set to a longer value.

It is apparent that the present invention is not limited to the above-described first to fifth embodiments. For example, in each of the above embodiments, the LED module used for the LED print head or the like is mainly described. However, the LED module of the present invention may be applied to an image sensor or the like which is constructed by arranging on a board chips each including plural PDs (photodiodes) as light emitting elements. Furthermore, in the present invention, the light emitting elements are controlled to selectively exhibit one of the light emitting function and the photosensing function by switching the application direction of a bias voltage to chips. Therefore, the LED module can be applied to not only an LED print head for print (exhibiting a print function) on a photosensitive member, but also a reading/writing head for reading/writing characters, images, etc.

What is claimed is:

1. A light emitting element module comprising:
    a board; and
    a plurality of chips arranged in an array on said board, each of said chips including a plurality of light emitting elements, each of said light emitting elements having a light emitting function, each of said chips having an upper surface;
    wherein respective upper surfaces of adjacent chips are displaced in a vertical direction; and
    wherein said plurality of chips are arranged on said board in one of either a first arrangement such that outermost edges of adjacent side surfaces of adjacent chips are aligned with each other in the vertical direction, and a second arrangement such that outermost edges of adjacent side surfaces of adjacent chips overlap each other in the vertical direction.

2. The module of claim 1, wherein said plurality of chips are arranged on said board such that outermost edges of adjacent side surfaces of adjacent chips are aligned with each other in the vertical direction.

3. The module of claim 1, wherein said plurality of chips are arranged on said board such that outermost edges of adjacent side surfaces of adjacent chips overlap each other in the vertical direction.

4. The module of claim 1, wherein said chips are arranged on said board in an arrangement line, and said upper surfaces of said chips are alternately displaced in the vertical direction along said arrangement line.

5. The module of claim 4, wherein each of said chips has an equal thickness, and said board has lower chip mount positions and upper chip mount positions, each of said upper chip mount positions being displaced from an adjacent lower chip mount position in the vertical direction by at least a distance equal to said thickness of each of said chips.

6. The module of claim 5, wherein said plurality of light emitting elements of each of said chips are arranged at intervals along each of said chips, said chips being arranged along said board in said arrangement line such that an interval between adjacent light emitting elements located at edges of adjacent chips is equal to an interval between light emitting elements of each of said chips.

7. The module of claim 5, wherein said lower chip mount positions and said upper chip mount positions are arranged alternately along said board, each of said upper chip mount positions comprising projecting portions having a height at least equal to said thickness of each of said chips, each of said lower chip mount positions comprising recess portions, said chips being positioned on said projecting portions and said recess portions.

8. The module of claim 7, wherein said plurality of chips are arranged on said board such that outermost edges of adjacent side surfaces of adjacent chips are aligned with each other in the vertical direction.

9. The module of claim 7, wherein said plurality of chips are arranged on said board such that outermost edges of adjacent side surfaces of adjacent chips overlap each other in the vertical direction.

10. The module of claim 7, wherein said projecting portions and said recess portions are formed by cutting said board.

11. The module of claim 7, wherein said projecting portions and said recess portions are formed by providing additional members on said board.

12. The module of claim 7, wherein a width of each of said recess portions in a direction perpendicular to said arrangement line is greater than a width of each of said chips in a direction perpendicular to said arrangement line.

13. The module of claim 7, wherein a length of each of said projecting portions in a direction along said arrangement line is less than a length of each of said chips in a direction along said arrangement line.

14. The module of claim 7, wherein each of said light emitting elements comprises a light emitting diode.

15. The module of claim 7, wherein each of said light emitting elements has a light emitting function and a photosensing function.

16. The module of claim 15, wherein each of said light emitting elements is capable of selectively exhibiting one of said light emitting function and said photosensing function by switching an application direction of a bias voltage to each of said chips.

17. The module of claim 1, wherein said plurality of chips comprises thick chips and thin chips, said thick chips having a greater thickness than said thin chips.

18. The module of claim 17, wherein said chips are arranged on said board in an arrangement line, said thick chips and said thin chips being alternately positioned along said arrangement line.

19. The module of claim 18, wherein said thick chips have side surfaces confronting said thin chips, said confronting side surfaces of said thick chips being inclined such that said upper surface of each of said thick chips overhangs said board.

20. The module of claim 19, wherein outermost edges of said confronting side surfaces of said thick chips are vertically aligned with outermost edges of respective confronting side surfaces of said thin chips.

21. The module of claim 19, wherein outermost edges of said confronting side surfaces of said thick chips overlap outermost edges of respective confronting side surfaces of said thin chips.

22. The module of claim 19, wherein said thin chips have side surfaces confronting said thick chips, said confronting side surfaces of said thin chips being inclined such that said upper surface of each of said thin chips overhangs said board.

23. The module of claim 19, wherein each of said light emitting elements comprises a light emitting diode.

24. The module of claim 19, wherein each of said light emitting elements has a light emitting function and a photosensing function.

25. The module of claim 24, wherein each of said light emitting elements is capable of selectively exhibiting one of said light emitting function and said photosensing function by switching an application direction of a bias voltage to each of said chips.

26. A printer head with a light emitting element module comprising:

a board; and a plurality of chips arranged on said board in an arrangement line, each of said chips including a plurality of light emitting elements, each of said light emitting elements having a light emitting function, each of said chips having an upper surface;

wherein respective upper surfaces of adjacent chips are alternately displaced in a vertical direction along said arrangement line;

wherein each of said chips has an equal thickness, and said board has lower chip mount positions and upper chip mount positions, each of said upper chip mount positions being displaced from an adjacent lower chip mount position in the vertical direction by at least a distance equal to said thickness of each of said chips; and wherein said plurality of chips are arranged on said board in one of either a first arrangement such that outermost edges of adjacent side surfaces of adjacent chips are aligned with each other in the vertical direction, and a second arrangement such that outermost edges of adjacent side surfaces of adjacent chips overlap each other in the vertical direction.

* * * * *